(12) United States Patent
Luo et al.

(10) Patent No.: US 11,450,582 B2
(45) Date of Patent: Sep. 20, 2022

(54) WAFER-LEVEL PACKAGE STRUCTURE

(71) Applicant: Ningbo Semiconductor International Corporation, Ningbo (CN)

(72) Inventors: Hailong Luo, Ningbo (CN); Clifford Ian Drowley, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 21 days.

(21) Appl. No.: 17/011,493

(22) Filed: Sep. 3, 2020

(65) Prior Publication Data

US 2020/0402876 A1 Dec. 24, 2020

Related U.S. Application Data

(60) Division of application No. 16/231,733, filed on Dec. 24, 2018, now Pat. No. 10,790,211, which is a
(Continued)

(30) Foreign Application Priority Data

Sep. 4, 2018 (CN) .......................... 201811027610.5

(51) Int. Cl.
*H01L 23/02* (2006.01)
*H01L 23/31* (2006.01)
(Continued)

(52) U.S. Cl.
CPC .......... *H01L 23/3114* (2013.01); *H01L 21/56* (2013.01); *H01L 23/291* (2013.01);
(Continued)

(58) Field of Classification Search
CPC ..... H01L 21/56; H01L 23/291; H01L 23/481; H01L 23/3114; H01L 24/09; H01L 24/32; H01L 24/73
(Continued)

(56) References Cited

U.S. PATENT DOCUMENTS 8,802,541 B2 * 8/2014 Wang ...................... H01L 24/08
438/459
10,665,582 B2 * 5/2020 Chen ....................... H01L 25/50
(Continued)

FOREIGN PATENT DOCUMENTS

CN 101443903 A 5/2009
CN 102072967 A 5/2011
(Continued)

*Primary Examiner* — Luan C Thai
(74) *Attorney, Agent, or Firm* — Anova Law Group, PLLC (57) ABSTRACT

A wafer-level package structure is provided, including a device wafer integrated with a first chip. The device wafer includes a first front surface integrated with the first chip and a first back surface opposite to the first front surface. A first oxide layer is formed on the first front surface. A second chip is provided to include a bonding surface, on which a second oxide layer is formed. A carrier substrate is provided to be temporarily bonded with the surface of the second chip that faces away from the bonding surface. The second chip is bonded with the device wafer through bonding the first and the second oxide layers using a fusion bonding process. The second chip and the carrier substrate are debonded. An encapsulation layer is formed on the first oxide layer and covers the second chip.

10 Claims, 4 Drawing Sheets

Related U.S. Application Data continuation of application No. PCT/CN2018/113103, filed on Oct. 31, 2018.

(51) Int. Cl.
| | | |
|---|---|---|
| *H01L 23/48* | (2006.01) | |
| *H01L 23/00* | (2006.01) | |
| *H01L 21/56* | (2006.01) | |
| *H01L 23/29* | (2006.01) | |

(52) U.S. Cl.
CPC ............ *H01L 23/481* (2013.01); *H01L 24/09* (2013.01); *H01L 24/32* (2013.01); *H01L 24/73* (2013.01)

(58) Field of Classification Search
USPC ........................................................ 257/678
See application file for complete search history.

(56) References Cited

U.S. PATENT DOCUMENTS

| | | | | |
|---|---|---|---|---|
| 10,930,633 B2* | 2/2021 | Chen | .................... | H01L 25/0655 |
| 2011/0285007 A1 | 11/2011 | Chi et al. | | |
| 2013/0207098 A1 | 8/2013 | Yeh et al. | | |
| 2013/0307165 A1 | 11/2013 | Wang et al. | | |
| 2015/0111329 A1 | 4/2015 | Wu et al. | | |
| 2015/0255505 A1 | 9/2015 | Jeoung et al. | | |
| 2015/0311188 A1 | 10/2015 | Mao et al. | | |

FOREIGN PATENT DOCUMENTS

| | | | |
|---|---|---|---|
| CN | 104925748 | A | 9/2015 |
| CN | 105140143 | A | 12/2015 |
| CN | 105185720 | A | 12/2015 |
| CN | 106952833 | A | 7/2017 |
| CN | 108028246 | A | 5/2018 |
| CN | 108346639 | A | 7/2018 |
| JP | 2006517344 | A | 7/2006 |
| JP | 2008060406 | A | 3/2008 |
| JP | 2009239288 | A | 10/2009 |
| JP | 2013077711 | A | 4/2013 |
| JP | 2016092190 | A | 5/2016 |
| KR | 20150046162 | A | 4/2015 |
| WO | 2012133760 | A1 | 10/2012 |
| WO | 2014046052 | A1 | 3/2014 |
| WO | 2014196105 | A1 | 12/2014 |

\* cited by examiner

WAFER-LEVEL PACKAGE STRUCTURE

CROSS-REFERENCES TO RELATED APPLICATIONS

This application is a divisional of U.S. patent application Ser. No. 16/231,733, filed on Dec. 24, 2018, which is a continuation application of PCT Patent Application No. PCT/CN 2018/113103, filed on Oct. 31, 2018, which claims the priority to Chinese patent application No. 201811027610.5, filed on Sep. 4, 2018, the contents of all of which are incorporated herein by reference in their entirety.

FIELD OF THE DISCLOSURE

The present disclosure generally relates to the field of semiconductor manufacturing technology and, more particularly, relates to a wafer-level package structure.

BACKGROUND

With continuous development of large scale integrated circuits, the feature dimensions of the integrated circuits (ICs) have been continuously decreasing. Accordingly, there are increased demands on the packaging technology of the ICs. Current packaging technology includes ball grid array (BGA) package, chip scale package (CSP), wafer-level package (WLP), three-dimensional (3D) package, system in package (SiP), etc.

For IC packaging with lower manufacturing cost and higher reliability, speed, and density, advanced packaging method mainly adopts wafer-level system-in-package (WLSiP). Compared with the conventional system in package (SiP), the WLSiP packaging method completes a packaging integration process on a wafer, thereby significantly reducing the area of the package structure, lowering manufacturing cost, optimizing electronic performance, and batch processing, etc. Labor amount and equipment requirements are therefore significantly reduced.

WLSiP packaging method mainly includes two important processes for physical connections and electrical connections. The physical connections between the device wafer and chips to-be-integrated are achieved using an organic bonding layer, for example, an adhesive film. In the electrical connecting process, semiconductor devices are electrically connected by a through-hole etching process, such as a through-silicon via etching process, and an electroplating process.

BRIEF SUMMARY OF THE DISCLOSURE

One aspect of the present disclosure provides a wafer-level packaging method. In the method, a device wafer integrated with a first chip is provided. The device wafer includes a first front surface integrated with the first chip and a first back surface opposite to the first front surface. A first oxide layer is formed on the first front surface. A second chip is provided to be integrated and includes a bonding surface. A second oxide layer is formed on the bonding surface of the second chip. A carrier substrate is provided. The surface of the second chip that faces away from the bonding surface is temporarily bonded with the carrier substrate. Afterwards, the first and the second chips are bonded by bonding the corresponding first and second oxide layers using a fusion bonding process. Then, the second chip and the carrier substrate are de-bonded. After the debonding process, an encapsulation layer is formed on the first oxide layer to cover the second chip.

Another aspect of the present disclosure provides a wafer-level package structure. The package structure includes a device wafer integrated with a first chip. The device wafer includes a first front surface integrated with the first chip and a first back surface opposite to the first front surface. A first oxide layer is formed on the first front surface. A second chip is bonded with the device wafer. The second chip includes a bonding surface, on which a second oxide layer is deposited. The second oxide layer is bonded with the first oxide layer using a fusion bonding process. An encapsulation layer is formed on the first oxide layer and covers the second chip.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

The production yield of a wafer-level system-in-package (WLSiP) is low for at least the following reasons. The device wafer and the chips that are to be integrated are bonded by an adhesive layer, for example, an adhesive film or a dry film. The adhesive layer has low thermal tolerance. When the temperature of a subsequent process is raised too high, the adhesive layer may easily fail, losing its original adhesive properties. In some cases, the device wafer and the chips may even fall apart, therefore severely affecting production yield for the WLSiP.

For solving the above technical problems, the present disclosure provides a wafer-level packaging method and a wafer-level package structure, providing increased production yield.

In an exemplary method, a device wafer integrated with a first chip is provided. The device wafer includes a first front surface integrated with the first chip and a first back surface opposite to the first front surface. A first oxide layer is deposited on the first front surface. A second chip is provided to be integrated. The second chip includes a bonding surface, on which a second oxide layer is deposited. A carrier substrate is provided. The surface of the second chip which faces away from the bonding surface is temporarily bonded with the carrier substrate. After bonding one surface of the second chip with the carrier substrate, the second chip is bonded with the device wafer through bonding the first and the second oxide layers using a fusion bonding process. Afterwards, the second chip and the carrier substrate are debonded. An encapsulation layer is formed on the first oxide layer and covers the second chip.

In one embodiment, after forming the first oxide layer on the first front surface of the device wafer and forming the second oxide layer on the bonding surface of the second chip, the first and the second oxide layers are bonded using a fusion bonding process to bond the second chip and the device wafer. The contact surfaces of the first and the second oxide layers are bonded through chemical covalent bonds by the fusion bonding process, accomplishing high mechanical bonding strength between the device wafer and the second chip, raising bonding reliability, thereby increasing the package production yield.

FIGS. 1-9 illustrate schematic structures corresponding to certain stages during an exemplary wafer-level packaging method according to an embodiment of the present disclosure.

Figure 1:
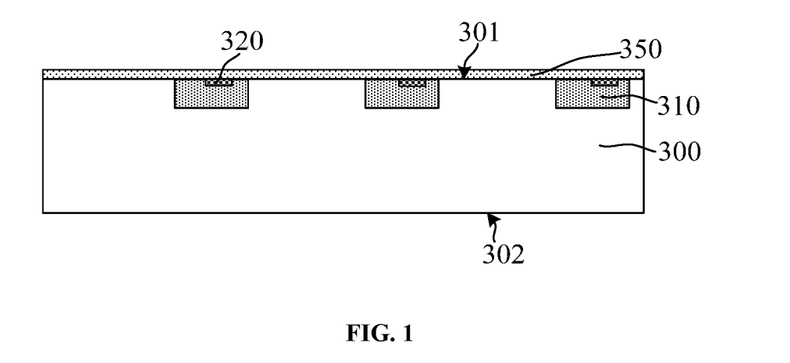
FIGS. 1-9 illustrate schematic structures corresponding to certain stages during an exemplary wafer-level packaging method according to an embodiment of the present disclosure.

Referring to FIG. 1, a device wafer 300 (e.g., a CMOS Wafer) integrated with at least one first chip 310 is provided. The device wafer 300 includes a first front surface 301 integrated with the first chip 310 and a first back surface 302 opposite to the first front surface 301.

In one embodiment, the disclosed wafer-level packaging method is used for realizing a wafer-level system-in-package (WLSiP). The device wafer 300 may be bonded with chips that are to be integrated in a subsequent process.

The device wafer 300 may be a wafer including devices, such as semiconductor devices, that have already been fabricated in/on the wafer. The device wafer 300 may be made by an ICs manufacturing technology, for example, using deposition, etching, etc. processes on a semiconductor substrate to make an N type metal-oxide-semiconductor (NMOS) device or a P type metal-oxide-semiconductor (PMOS) device. A dielectric layer, a metal interconnection structure, and a metal interconnection pad, etc. may be formed on the device, such that the device wafer 300 may be integrated with at least one first chip 310 and a first pad 320 may be formed in the first chip 310.

When the device wafer is integrated with a plurality of the first chips 310, the plurality of the first chips 310 may be of the same type or of different types.

In one embodiment as shown in FIGS. 1-9, three first chips 310 are integrated in the device wafer 300 for the purpose of illustration. However, the number of first chips 310 is not limited to three, any number of first chips may be encompassed in the present disclosure.

In one embodiment, a silicon substrate is used as the semiconductor substrate for the device wafer 300. In other embodiments, other materials for the semiconductor substrate include germanium, silicon germanium, silicon carbide, gallium arsenide, or indium gallium, etc. The semiconductor substrate may also be a silicon on insulator (SOI) or a germanium on insulator (GOI), or any other types of substrates. The material for the semiconductor substrate may be selected to meet process requirements and to be of high integrability with semiconductor processes.

The device wafer 300 includes a first front surface 301 integrated with the first chip 310 and a first back surface 302 opposite to the first front surface 301. The first front surface 301 exposes a first pad 320. The first pad 320 is a bond pad for the device wafer 300 and is used for connecting the first chip 310 with any other suitable electric circuits. The first back surface 302 may be a bottom surface of the semiconductor substrate facing away from the first pad 320 in the device wafer 300.

Based on actual process requirements, thickness T1 of the device wafer is about 10 microns to about 100 microns.

Referring back to FIG. 1, a first oxide layer 350 is deposited on the first front surface 301.

The first oxide layer 350 functions as a bonding layer for a subsequent fusion bonding process to form physical bonding between the device wafer 300 and the chips that are to be integrated. The fusion bonding process makes a strong bonding between the device wafer 300 and the chips.

In one embodiment, the first oxide layer 350 is made of silicon oxide. By selecting silicon oxide material, the device wafer 300 and the chips may be bonded by forming Si—O—Si covalent bonds in a subsequent fusion bonding process. Because of high atomic bonding energy between silicon and oxygen, the bond strength between the device wafer 300 and the chips is further increased. Also, the silicon oxide material is highly process compatible, a commonly selected material, and of low cost. Use of silicon oxide for the first oxide layer is beneficial for decreasing process difficulty, lowering production cost, and further reducing negative effects on properties of the package structures. In other embodiments, the first oxide layer may be made of hafnium oxide, aluminum oxide, and/or lanthanum oxide.

For example, the first oxide layer 350 is formed by an atomic layer deposition (ALD) process. The atomic layer deposition process is conducted by pulse-alternately introducing precursors in gas phase to a reaction chamber. The substances are chemically adsorbed onto a deposition substrate and a surface chemical reaction occurs. By the atomic layer deposition process, the first oxide layer 350 is formed as an atomic layer on the first front surface 301 with a more uniform deposition rate, a more uniform thickness, and greater structural uniformity, thereby better coverage of the first oxide layer 350. Also, the process temperature of atomic layer deposition is usually low, which is beneficial for a low thermal budget, decreasing the probabilities of both wafer distortion and device performance variation.

In other embodiments, based on the material selected for the first oxide layer, the process for forming the first oxide layer may include low pressure chemical vapor deposition (LPCVD), metal organic chemical vapor deposition (MOCVD), physical vapor deposition (PVD), or pulsed laser deposition (PLD).

Figure 2:
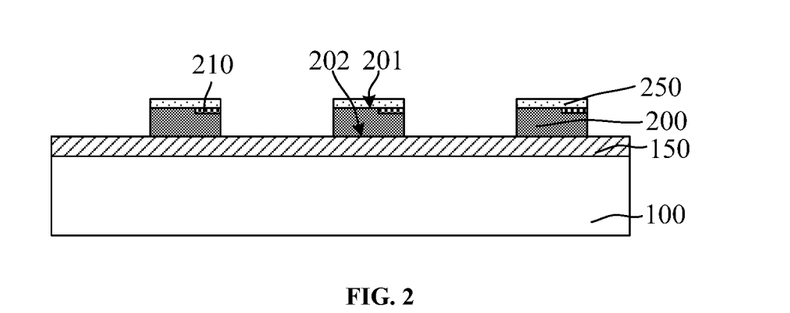

Referring to FIG. 2, a second chip 200 to be integrated is provided. The second chip 200 includes a bonding surface (not shown in FIG.).

The second chip 200 is a chip to be integrated in the WLSiP. There is at least one second chip 200. In one embodiment, the number of second chips 200 is same as the number of first chips 310 (shown in FIG. 1).

The second chip 200 may include an active component, a passive component, a micro-electromechanical system, an optical component, or a combination of the above components. For example, the second chip 200 may include memory chip, communication chip, processing chip, flash memory chip, or logic chip. In other embodiments, the second chip may be any suitable chip with other functionalities.

In one embodiment, the WLSiP assembles a plurality of the second chips 200 with different functionalities in one package structure. The plurality of the second chips 200 is obtained by dicing multiple wafers of different types and with different functionalities. In other embodiments, based on actual process requirements, a plurality of the second chips may be of the same type or same functionality.

By integrating a plurality of the second chips 200 in the device wafer 300 (shown in FIG. 1) and completing the packaging process on the device wafer 300, area occupied by the package structure may be significantly reduced, leading to the following advantages: reduction of manufacturing cost, optimizing electronic performance, and making batch production possible, thereby reducing labor cost and equipment requirements.

In one embodiment, the wafer-level packaging method is to achieve a heterogeneous integration. A plurality of the second chips 200 is made of silicon wafer. In other embodiments, the second chips may be made of other materials.

In one embodiment, there are three second chips 200 in the device wafer for the purpose of illustration. However, the number of the second chips 200 is not limited to three.

The second chip 200 may be made by IC manufacturing technology. The second chip 200 may include NMOS or PMOS devices formed on a semiconductor substrate. The second chip 200 may also include a dielectric layer, a metal interconnection structure, and/or a pad structure.

In one embodiment, the second chip 200 may include a second front surface 201 on which a second pad 210 is formed and a second back surface 202 opposite to the second front surface 201. The second front surface 201 exposes the surface of the second pad 210. The second pad 210 functions as a bond pad for electrically connecting the second chip 200 with any other suitable electric circuits. The second back surface 202 is the bottom surface of the semiconductor substrate of the second chip 200 facing away from the surface that contains the pad 210.

In one embodiment, the bonding surface of the second chip 200 is the second front surface 201. The second front surface 201 is made to face the device wafer 300 in a subsequent process for forming an interconnection structure passing through the device wafer 300 and electrically connecting to the second chip 200, for example, a through-silicon via interconnection structure. The second front surface 201 facing the device wafer 300 is beneficial for decreasing thickness of the interconnection structure, reducing the process difficulties of forming the interconnection structure, and reducing the process cost. In other embodiments, depending on the actual process requirements, the bonding surface may be the second back surface, which is made to face the device wafer in a subsequent process.

Referring to FIG. 2 again, a second oxide layer 250 is deposited on the bonding surface of the second chip 200 (not shown in FIG.).

The second oxide layer 250 functions as a bonding layer in a subsequent fusion bonding process for physically bonding the device wafer 300 and the second chip 200 with an increased bonding strength.

When forming an interconnection structure to electrically connect through the device wafer 300 to the second chips 200, the process of forming the interconnecting structure may include a through-hole etching process. The through-hole etching process etches the device wafer 300 and the second oxide layer 250 sequentially. In comparison with using an organic adhesive layer as the bonding layer, because the second oxide layer 250 is made of an inorganic material and the device wafer 300 is also made of an inorganic material, using the second oxide layer 250 as the bonding layer has advantages of decreasing process difficulties of a subsequent through-hole etching and avoiding the problem of etching too large a diameter of the internal hole in the second oxide layer 250 after the through-hole etching process, thereby further improving the electrical interconnection properties of the through-hole structure.

In one embodiment, the second oxide layer 250 is made of the same material as that of the first oxide layer 350, therefore further increasing the bonding strength between the second oxide layer 250 and the first oxide layer 350. For example, using an atomic layer deposition process to form the second oxide layer 250, which is made of silicon oxide material.

In other embodiments, the second oxide layer may be made of hafnium oxide, aluminum oxide, or lanthanum oxide. Based on the material selected for the second oxide layer, the process of forming the second oxide layer may include low pressure chemical vapor deposition, metal organic chemical vapor deposition, physical vapor deposition, or pulsed laser deposition.

For a more detailed description of the second layer 250, please refer to relevant descriptions of the first oxide layer 350, which would not be repeated here.

In one embodiment, the bonding surface of the second chip 200 is the second front surface 201. Correspondingly, the second oxide layer 250 is deposited on the second front surface 201. In other embodiments, when the bonding surface is the second back surface, the second oxide layer would be deposited on the second back surface.

A plurality of the second chips 200 may be obtained by singulating or dicing a wafer. For the purpose of increasing production efficiency and quality of the second oxide layer 250, after forming the second oxide layer 250 on the wafer integrated with the second chips 200, the wafer including the second oxide layer 250 is cut to form a plurality of the second chips 200 under the second oxide layer 250.

Referring back to FIG. 2, a carrier substrate 100 is provided. The surface of the second chip 200 (not shown in FIG.) facing away from the bonding surface is temporarily bonded with the carrier substrate 100.

The carrier substrate 100 provides support to the plurality of the second chips 200 for improving operability and ease of proceeding with subsequent processes. Through the temporary bonding, the second chip 200 and the carrier substrate 100 could be easily debonded in a subsequent process.

In one embodiment, the carrier substrate 100 is a carrier wafer. For example, the carrier substrate 100 may include a semiconductor substrate such as silicon substrate, organic glass wafer, inorganic glass wafer, resin wafer, wafer of a semiconductor material, oxide crystal wafer, ceramic wafer, metal wafer, organic plastic wafer, inorganic oxide wafer, or wafer of a ceramic material.

In one embodiment, an adhesive layer 150 is deposited on the carrier substrate 100. The surface of the second chip 200 that faces away from the bonding surface is temporarily bonded with the carrier substrate 100 through the adhesive layer 150.

For example, the adhesive layer 150 may include die attach film (DAF), dry film, or a combination of the above two films.

The dry film is a viscous photoresist, commonly used for semiconductor chip package or for making printed electrical circuits boards. The photoresist dry film is made by coating a solvent-free photoresist onto a polyester base followed by covering the photoresist with a polyethylene thin film. The polyethylene film is removed before use. The photoresist is pressed onto a substrate before being passed through a light exposure and a developing process to form a pattern in the dry film.

In the semiconductor packaging process, the adhesive film is an ultra thin adhesive used for connecting semiconductor chip with package substrate, or chip with another chip. Such thin adhesive has high performance reliability, easy processability, and an advantage of achieving lamination and thinning of semiconductor packages.

In other embodiments, the surface of the second chip 200 that faces away from the bonding surface may be temporarily bonded with the carrier substrate by an electrostatic bonding process with no need of adhesive. In the process of electrostatic bonding, the second chip and the carrier substrate are connected separately with electrodes of opposite polarities. A voltage is applied to generate opposite charges on the surfaces of the second chip and the carrier substrate, thereby forming a strong electrostatic attraction to achieve a physical bond between the second chip and the carrier substrate.

In one embodiment, the bonding surface of the second chip 200 is the second front surface 201. Correspondingly, through the adhesive layer 150, the second back surface 202 of the second chip 200 is temporarily bonded to the carrier substrate 100. In other embodiments, when the bonding surface of the second chip is the second back surface, the second front surface of the second chip would be temporarily bonded to the carrier substrate.

In one embodiment, after forming the second oxide layer 250 on the bonding surface of the second chip 200, the surface of the second chip 200 that faces away from the bonding surface is temporarily bonded to the carrier substrate, thereby further simplifying the process of forming the second oxide layer 250.

In other embodiments, based on actual process requirements, after temporarily bonding the surface of the second chip that faces away from the bonding surface to the carrier substrate, the second oxide layer 250 is deposited on the bonding surface.

Figure 3:
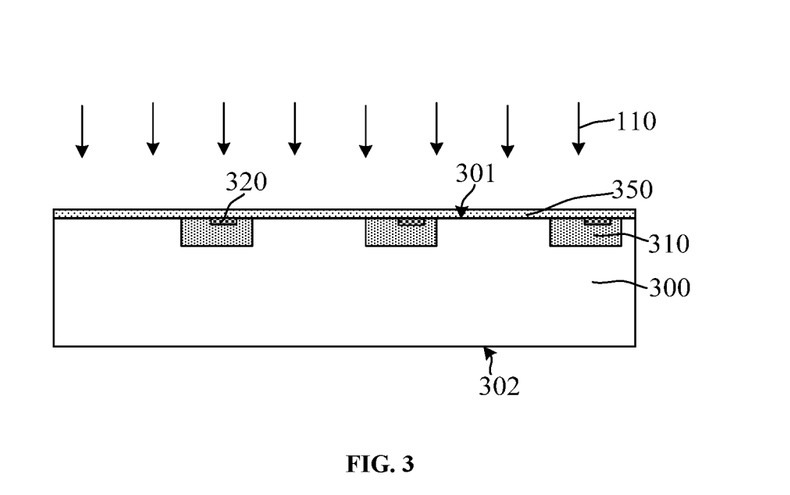
Figure 4:
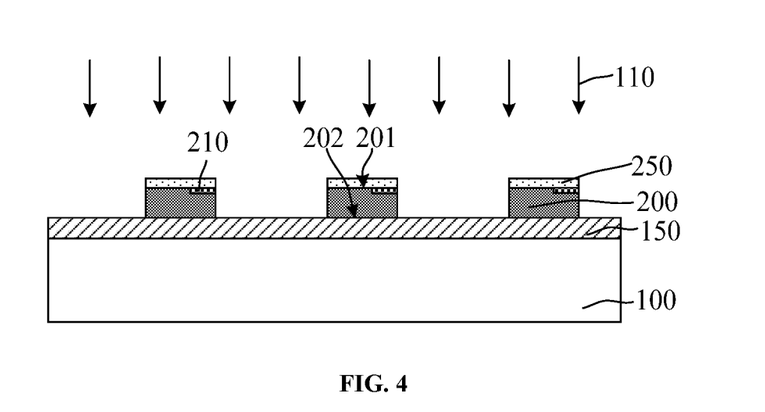

Referring to both FIGS. 3 and 4, after temporarily bonding the surface (not shown in FIG.) of the second chip that faces away from the bonding surface to the carrier substrate 100, the second chip 200 and the device wafer 300 are bonded through bonding the second oxide layer 250 and the first oxide layer 350 using a fusion bonding process.

Fusion bonding is formed by an interfacial chemical bonding. In the fusion bonding process, unsaturated Si atomic bonds, generated on the surfaces of the first oxide layer 350 and the second oxide layer 250, are reacted to form covalent bonds on the contact interface, achieving a strong bond between the first oxide layer 350 and the second oxide layer 250. The fusion bonding increases the level of reliability of the bonding process, further increases the bonding strength of the device wafer 300 and the second chip 200, minimizes negative effects of subsequent processes on the bonding strength, and increases packaging production yield.

For example, referring again to FIGS. 3 and 4, the fusion bonding process includes a following step: plasma activation treatment 110 on the surfaces of the first oxide layer 350 (shown in FIG. 3) and second oxide layer 250 (shown in FIG. 4).

On the one hand, the plasma activation treatment 110 converts the contaminants and impurities on the surfaces of first 350 and the second 250 oxide layers into a gas phase which may then be removed by vacuum pumping of the plasma system, thereby accomplishing surface purification, such as well removing metallic and organic contaminants.

On the other hand, plasma ions from the plasma activation treatment 110 impact the surfaces of the first 350 and the second 250 oxide layers, offering energy to unstable and non-bridged oxygen atoms, breaking oxygens' original covalent bonds, and laying a good foundation for forming chemical covalent bonds in the contact surfaces of the first 350 and the second 250 oxide layers.

In one embodiment, both the first 350 and the second 250 oxide layers are made of silicon oxide. After plasma activation treatment 110, Si atoms with unsaturated bonds are formed on the surfaces of the first 350 and the second 250 oxide layers.

The reactive gas for the plasma activation treatment 110 includes Ar, $N_2$, $O_2$, $SF_6$ or a combination of the above gases.

In one embodiment, $O_2$ is used as the reactive gas in the plasma activation treatment 110, which becomes oxygen plasma activation treatment.

The radiofrequency power for the plasma activation treatment 110 is limited within a range. The radiofrequency power source generates a radio frequency electric field that accelerates electrons, causing impact from the electrons to reactive gas molecules, thereby passing kinetic energy to the reactive gas molecules and ionizing the reactive gas molecules to form plasma.

Too low a radiofrequency power would make it difficult to ionize the reactive gas, causing a shortage of plasma and lowering stability of the plasma, thereby decreasing the plasma activation effect and decreasing the bonding strength between the first oxide layer 350 and the second oxide layer 250. However, if the radiofrequency power is too high, kinetic energy of the reactive gas molecules received from the plasma would be too high, causing too strong an impact, and damage and micro-defects to surfaces of the first 350 and the second 250 oxide layers. Also, a subsequent annealing process may easily yield empty annealing holes, resulting in a decrease of the bonding strength between the first 350 and the second 250 oxide layers. Additionally, too high a radiofrequency power would consume too much energy and increase processing cost.

In one embodiment, the radiofrequency power for plasma activation treatment 110 is in the range of 20 W to 200 W.

The process pressure for the plasma activation treatment is limited within a range. The pressure affects the radiofrequency power. An excessively high pressure would shorten mean free path of the plasma ions and increase impact frequency among plasma ions, thereby negatively affecting the plasma activation treatment 110. Correspondingly, the radiofrequency would be increased to compensate for the negative effect. On the other hand, too low a pressure would decrease the stability of the plasma and requires an increase of the radiofrequency power.

In one embodiment, the process pressure is adjusted according to radiofrequency power requirement for plasma activation treatment 110 within a coordinating range. For example, the process pressure is in the range of 0.1 mbar to 10 mbar.

Process time for the plasma activation treatment 110 is limited within a range. Under a certain radiofrequency power and a certain reactive gas flow rate, too short a process time would decrease the effect of the plasma activation treatment 110, resulting in a decreased bonding strength between the first 350 and the second 250 oxide layers. In contrast, too long a process time would cause damage to, and form micro-defects on, the surfaces of the first 350 and the second 250 oxide layers. Also, too long a process time would produce excess hydroxyl groups and may yield excess side products, such as $H_2O$ and $H_2$, etc., thereby resulting in forming empty annealing holes, a decrease of the bonding strength between the first 350 and the second 250 oxide layers, and an increase of the process cost. In one embodiment, the process time for the plasma activation treatment 110 is in the range of about 0.1 minute to about 10 minutes.

In one embodiment, for the plasma activation treatment 110, the radiofrequency power, the process pressure, the reactive gas flow rate, and the process time are designed within reasonable ranges, and coordinate with each other, therefore increasing the process efficiency, the process stability, lowering the process cost, and at the same time optimizing the activation effect of the first 350 and the second 250 oxide layers.

In one embodiment, the fusion bonding process further includes a step of deionized water cleaning of the surfaces of the first 350 and the second 250 oxide layers after the plasma activation treatment 110 (shown in FIGS. 3 and 4). After the deionized water cleaning, the surfaces of the first 350 and the second 250 oxide layers are dried by a drying process.

Deionized water cleaning and drying processes improve surface quality of the first 350 and the second 250 oxide layers, thereby further increasing the bonding strength between the first 350 and the second 250 oxide layers.

For example, the surfaces of the first 350 and the second 250 oxide layers are rinsed with deionized water. After completing the deionized water cleaning, the first 350 and the second 250 oxide layers are blown dry by $N_2$ gas to complete the drying process.

Figure 5:
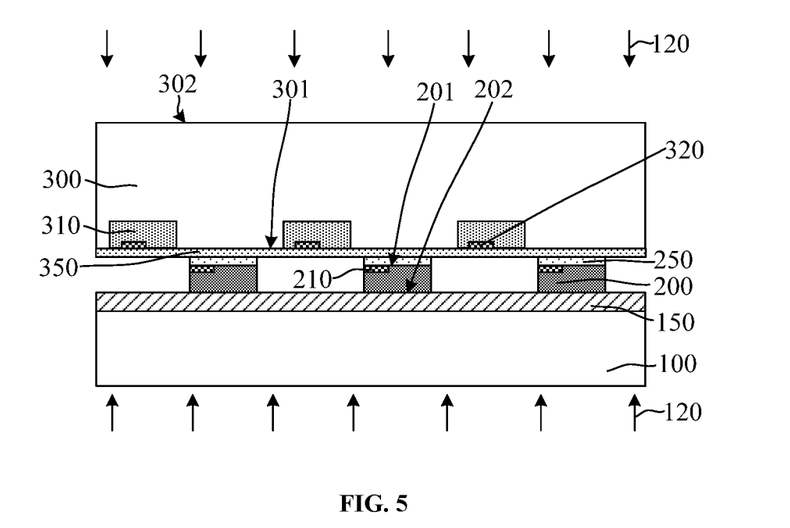

Referring to FIG. 5, the fusion bonding process further includes the following steps: after the drying process, according to a pre-set relative position relationship between the second chips 200 and the first chips 310, the second 350 and the first 250 oxide layers are set up relatively and then attached. A bonding force is applied to the device wafer 300 and the second chips 200 to conduct a pre-bonding treatment 120.

After the plasma activation treatment 110, silicon atoms with unsaturated chemical bond are formed on the surfaces of the first 350 and the second 250 oxide layers. By the pre-bonding treatment 120, an interfacial chemical bond is formed between the first 350 and the second 250 oxide layers.

Based on actual process requirements, after setting up and attaching the second oxide layer 250 with the first oxide layer 350, each second chip 200 has a one to one correspondence with a first chip 310. Projections of the second chip 200 and the first chip 310 on the first oxide layer 350 are staggered from each other. To the first back surface 302 of the device wafer 300 and the surface of the carrier substrate 100 that faces away from the second chip 200 is applied a bonding compressional force to conduct pre-bonding treatment 120.

In comparison with a scheme of applying a bonding force directly to the second chips 200, after temporarily bonding the second back surface 202 of the second chip 200 with the carrier substrate 100, the technique of conducting the pre-bonding treatment 120 has advantages of increasing uniformity of applied force to the plurality of the second chips 200, and further prevents possible damage to the second chips 200 by the pre-bonding treatment 120.

An increase of the bonding compressional force for the pre-bonding treatment 120 would increase effective interfacial chemical bonding and bonding strength between the first 350 and the second 250 oxide layers. However, too high a bonding force would cause undesirable effects for the device wafer 300, the first oxide layer 350, the second oxide layer 250, and the second chip 200, such as distortion problems, etc. In one embodiment, the bonding compressional force for the pre-bonding treatment 120 is in a range of about 1 N to about 20 N. Such bonding force range is suitable for achieving effective interfacial chemical bonding between the first 350 and the second 250 oxide layers, at same time, lowering the process risks.

An increase of the process time for the pre-bonding treatment 120 would increase effective interfacial chemical bonding and bonding strength between the first 350 and the second 250 oxide layers. However, too long a process time would waste process time and decrease process efficiency. In one embodiment, the process time for the pre-bonding treatment 120 is in the range of about 1 second to about 60 seconds. Such a process time range is suitable for achieving effective interfacial chemical bonding between the first 350 and the second 250 oxide layers, at same time, increasing process efficiency.

In one embodiment, the fusion bonding process further includes a following step: after the pre-bonding treatment 120, conducting an annealing treatment for the device wafer 300 and the second chip 200.

By the annealing treatment, a dehydration condensation reaction occurs on the contact surfaces of the first 350 and the second 250 oxide layers, forming Si—O—Si covalent bonds in the interface between the first 350 and the second 250 oxide layers. Because of the high atomic bond energy of Si—O covalent bond, the bonding strength between the first 350 and the second 250 oxide layers is further increased.

The annealing temperature is limited in a range. Too low an annealing temperature would reduce the positive effect of the dehydration condensation reaction, and is not beneficial for the bonding strength of the first 350 and the second 250 oxide layers. In contrast, too high an annealing temperature would cause negative effects on the performance of devices in the device wafer 300 and the second chip 200. In one embodiment, the annealing temperature is in the range of about 200° C. to about 500° C.

In one embodiment, the annealing temperature is relatively low for the purpose of decreasing negative effects on the performance of devices in both the device wafer 300 and the second chip 200.

The process time for the annealing treatment is limited in a range. Too short an annealing time would not be sufficient to complete the dehydration condensation reaction, and therefore would not be sufficient to increase the bonding strength between the first 350 and the second 250 oxide layers. Too long an annealing time would waste process time and reduce process efficiency. Also, putting the device wafer 300 and the second chip 200 in an annealing environment for too long would increase process risks. The annealing time is in the range of about 20 minutes to about 200 minutes.

In one embodiment, the annealing temperature and the annealing time are designed in coordination within a reasonable range, thereby increasing the bonding strength, and at same time reducing the probability of causing side effects.

The second chips 200 in the device wafer are separated from each other. In the fusion bonding process, the carrier substrate 100 provides support for the plurality of the second chips 200, lowering the probability of the second chips 200 falling off, and ensuring the fusion bonding process to proceed properly.

Figure 6:
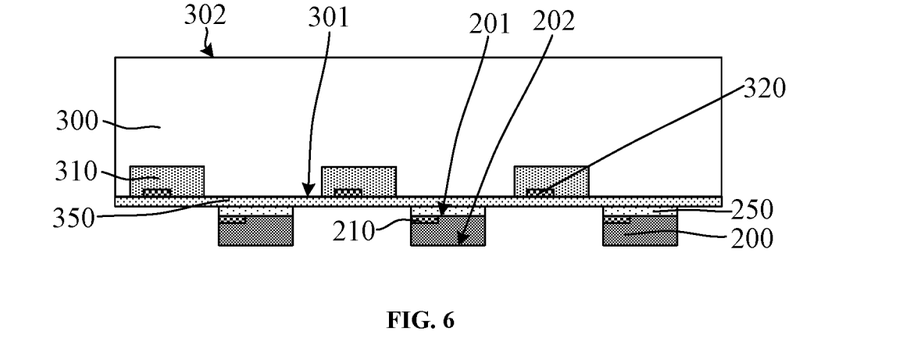

Referring to FIG. 6, after bonding the second chips 200 with the device wafer 300, the second chips 200 and the carrier substrate 100 (shown in FIG. 5) are debonded to separate the second chips 200 from the carrier substrate 100 and to remove the adhesive layer 150 (shown in FIG. 5).

For example, the debonding process may include chemical corrosion, mechanical stripping, mechanical polishing, thermal baking, ultraviolet irradiation, laser ablation, chemical mechanical polishing, wet peeling, or a combination of the above processes. A proper debonding process may be chosen based on the material selected for the adhesive layer 150.

Figure 7:
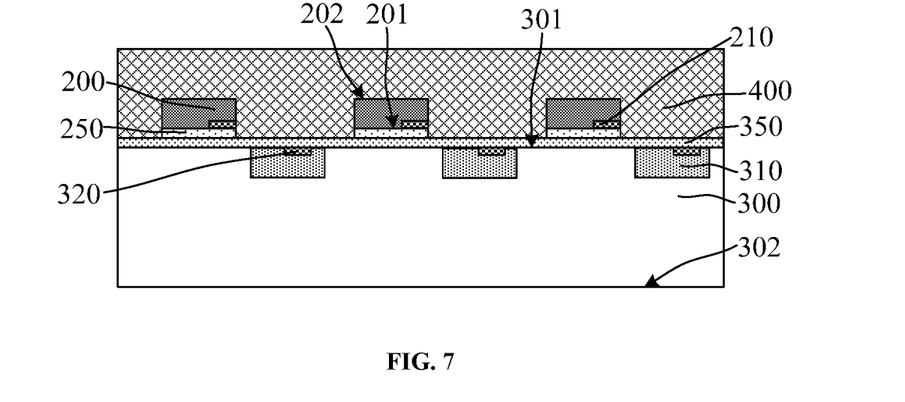

Referring to FIG. 7, after the debonding process, an encapsulation layer 400 is formed on the first oxide layer 350 and covers the second chips 200.

The encapsulation layer 400 covers the second chips 200 and the first oxide layer 350, functioning for sealing and moisture proofing, protecting the first chips 310 and the second chips 200, reducing the probabilities of the first chips 310 and the second chips 200 being damaged, contaminated, and oxidized, thereby optimizing the package structure properties.

After forming the encapsulation layer 400 on the first oxide layer 350 to cover the second chips 200, the encapsulation layer 400 is in contact with the first oxide layer 350. Appropriate properties of water adsorption and chemical stability of the encapsulation layer 400 further increase good performance and reliability of the package structure.

The encapsulation layer 400 is formed after the fusion bonding process. Thus, possible negative effects on the encapsulation layer 400 from the annealing temperature of the annealing in the fusion bonding process could be avoided, further ensuring quality and performance of the encapsulation layer 400.

In one embodiment, the encapsulation layer 400 is made of epoxy. Epoxy has advantages of low shrinkage, good adhesive property, corrosion resistant, good electrical properties, and low cost, thereby epoxy is widely used as package material for electronic devices and integrated circuits.

In one embodiment, by injection molding process, liquid or solid molding compound is used for forming the encapsulation layer 400. For example, the molding process may be a hot press injection molding process.

In one embodiment, the encapsulation layer 400 may have a wafer shape. Diameter of the wafer shaped encapsulation layer 400 may be same as the diameter of the device wafer 300. In other embodiments, the encapsulation layer may have other suitable shapes.

Figure 8:
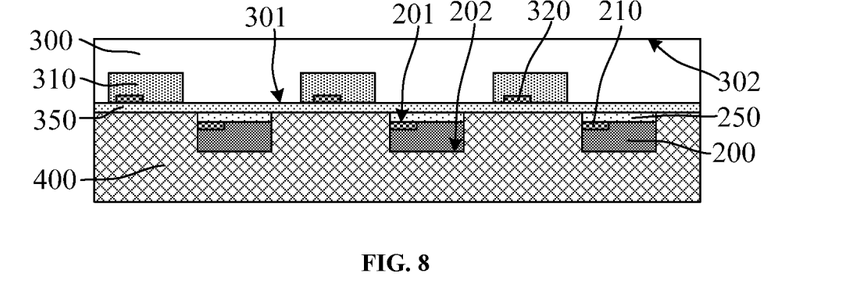

Referring to FIG. 8, the packaging method further includes a thinning process for the first back surface 302 of the device wafer 300 after forming the encapsulation layer 400.

By thinning the first back surface 302, the thickness of the device wafer 300 is decreased. The thinning process of the first back surface 302 may improve heat transfer through the device wafer 300, benefiting subsequent processes to proceed properly, reducing overall thickness of the package structure, and increasing performance of the package structure.

In one embodiment, the thinning process may include one or more processes of back polishing, chemical mechanical polishing (CMP), and wet etching.

In the device wafer 300 manufacturing process, for the purpose of controlling the stop position of the thinning process, a deep trench separation structure for limiting the stop position may be formed at the bottom of the semiconductor substrate of the device wafer 300, thereby enabling the thinning process to stop at bottom of the deep trench structure.

In another embodiment, in the device water 300 manufacturing process, a neutral doping ion, such as an oxygen ion or nitrogen ion, or a combination of the both, is used to form a stop zone in the semiconductor substrate of the device wafer 300, thereby enabling the thinning process to stop at the bottom of the stop zone.

In other embodiments, when the semiconductor substrate of the device wafer is silicon on insulator or germanium on insulator, the bottom layer of the semiconductor substrate may be thinned to enable the thinning process stopping at bottom of the insulator layer.

After the thinning process, the thickness of the device wafer 300 is limited to a range. If the device wafer 300 is too thin, mechanical properties of the device wafer 300 would not be sufficiently strong, introducing negative effects on device structures formed in the device wafer 300. If the device wafer 300 is too thick, it is not beneficial for increasing performance of the package structure. In one embodiment, after the thinning process, the device wafer 300 has a thickness in the range of 5 microns to about 10 microns.

Figure 9:
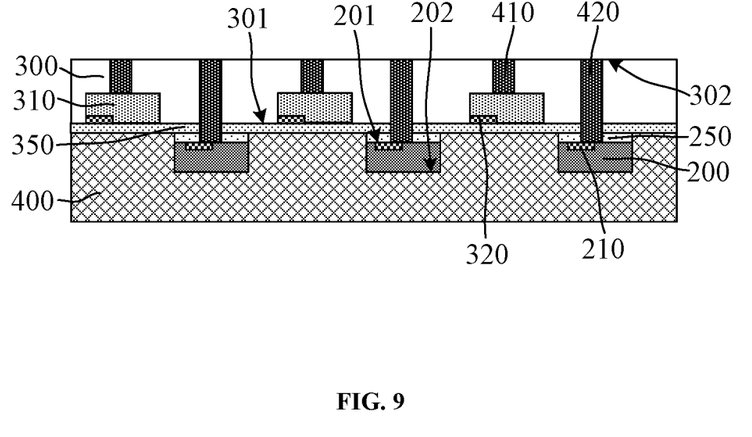

Referring to FIG. 9, after the thinning process, a first interconnection structure 410 for connecting the first chip 310 and a second interconnection structure 420 for connecting the second chip 200 are formed in the device wafer 300.

Through the first 410 and the second 420 interconnection structures, the first chip 310 and the second chip 200 are connected with other electric circuits; and the first chip 310 and the second chip 200 are connected.

In one embodiment, the first 410 and the second 420 interconnection structures are through-silicon via (TSV) interconnection structures. It means that the first 410 and the second 420 interconnection structures are formed by an etching process and a plating process through a through-silicon via. For example, the first interconnection structure 410 is electrically connected with metal interconnection structure in the first chip 310; and the second interconnection structure 420 is electrically connected with the second pad 210 in the second chip 200.

In one embodiment, the first 410 and the second 420 interconnection structures are made of copper material. In other embodiments, the first 410 and the second 420 interconnection structures may be made of aluminum, tungsten, and titanium.

The present disclosure also provides a wafer-level package structure. Referring back to FIG. 9, FIG. 9 illustrates a schematic structure of an exemplary wafer-level package structure according to another embodiment of the present structure.

The wafer-level package structure includes a device wafer 300 integrated with a first chip 310. The device wafer 300 includes a first front surface 301 integrated with the first chip 310 and a first back surface 302 opposite to the first front surface 301. A first oxide layer 350 is deposited on the first front surface 301. A second chip 200 is bonded to the device wafer 300. The second chip 200 includes a bonding surface (not shown in FIG.). A second oxide layer 250 is deposited on the bonding surface. The second oxide layer 250 is bonded with the first oxide layer 350 using a fusion bonding process. An encapsulation layer 400 is formed on the first oxide layer 350 and covers the second chip 200.

In one embodiment, the wafer-level package structure is the WLSiP. WLSiP has the advantages of significantly decreasing area of the package structure, reducing manufacturing cost, optimizing electrical performance, and making batch manufacturing possible, thereby decreasing labor cost and equipment requirements.

The device wafer 300 may be a wafer including devices, such as semiconductor devices, that have already been fabricated in/on the wafer. The device wafer 300 may include an NMOS device on semiconductor substrate or a PMOS device on semiconductor substrate. The device wafer 300 may also include a dielectric layer, a metal interconnection structure, and a metal interconnection pad, etc. Thus, the device wafer 300 is integrated with at least one first chip 310 and a first pad 320 formed in the first chip 310.

In one embodiment, the device wafer 300 includes a first front surface 301 integrated with the first chip 310, a first back surface 302 opposite to the first front surface 301, and a first pad 320 with an exposed surface in the first front surface 301 of the device wafer 300. The first back surface 302 is the bottom surface of the semiconductor substrate which faces away from the first pad 320 in the device wafer 300.

In one embodiment, the device wafer 300 has a thickness in the range of 5 microns to about 10 microns. The device wafer 300 is relative thin for the purpose of improving heat dissipation of the device wafer 300, benefiting the packaging process, decreasing overall thickness of the package structure, and increasing performance of the package structure.

For more detailed description of the device wafer 300, please refer to the descriptions of the previous embodiments, which would not be repeated here.

In one embodiment, at least one second chip 200 may be included. The number of the second chips 200 is same as the number of the first chips 310. The second chips 200 may include an active component, a passive component, a microelectromechanical system, an optical component, and a combination of the above components. For example, the second chip 200 may include memory chip, communication chip, processing chip, flash memory chip, or logic chip. In other embodiments, the second chip may include chips with other functionalities.

In one embodiment, there is a plurality of the second chips 200. The plurality of the second chips 200 is obtained by singulating or dicing multiple wafers with different functionalities and different types. In other embodiments, based on actual process requirements, the plurality of the second chips may be of the same type and may have the same functionality.

In one embodiment, based on actual process requirements, each second chip 200 has a one to one correspondence with a first chip 310. Projections of the second chip 200 and the first chip 310 on the first oxide layer 350 are staggered from each other.

The second chip 200 may be made by an ICs manufacturing technology. The second chip 200 may include NMOS device on semiconductor substrate or PMOS device on semiconductor substrate, dielectric layer, metal interconnection structure and pad structure, etc.

For example, the second chip 200 includes a second front surface 201 on which a second pad 210 is formed, and a second back surface 202 opposite to the second front surface 201. The second front surface 201 exposes the second pad 210. The second back surface 202 is the bottom surface of the semiconductor substrate that faces away from the second pad 210 in the second chip 200.

In one embodiment, the bonding surface of the second chip 200 is the second front surface 201. The second front surface 201 faces the device wafer 300. When manufacturing the wafer-level package structure, having the second front surface 201 face the device wafer 300 would be beneficial in decreasing process difficulties of forming interconnection structure, such as through-silicon via interconnection structure, reducing process cost, and decreasing thickness of the interconnection structure. In other embodiments, based on actual process requirements, the bonding surface may be the second back surface.

For more detailed description about the second chip 200, please refer to the description of the previous embodiment, which would not be repeated here.

The second oxide layer 250 is bonded with the first oxide layer using a fusion bonding process for the purpose of physically bonding the device wafer 300 and the second chip 200.

The fusion bonding process is to accomplish bonding by forming interfacial chemical bonds. The contact surfaces of the first 350 and the second 250 oxide layers are bonded by chemical covalent bonds. As a result, the bonding between the first 350 and the second 250 oxide layers is strong, leading to an increased production yield of the wafer-level package structures.

The manufacturing of the wafer-level package structures may include a through-hole etching process, which etches the device wafer 300 and the second oxide layer 250 sequentially. In comparison with using an organic adhesive layer as the bonding layer, because the second oxide layer 250 is made of an inorganic material and the device wafer 300 is also made of an inorganic material, using the second oxide layer 250 as the bonding layer has advantages of decreasing process difficulties of through-hole etching and avoiding the problem of etching too large a diameter of the internal hole in the second oxide layer 250 after the through-hole etching process, thereby further improving the electrical interconnecting properties of the through-hole structure.

In one embodiment, the second 250 and the first 350 oxide layers are made of the same silicon oxide material. Thus, the first 350 and the second 250 oxide layers are bonded by forming Si—O—Si covalent bonds. Because of high atomic bonding energy of silicon and oxygen, the bonding strength between the first 350 and the second 250 oxide layers is effectively increased.

Silicon oxide material is highly process compatible. Also, silicon oxide is a commonly selected material for processing and is of low cost. By selecting silicon oxide material for the oxide layer, process difficulties and cost may be further reduced, at the same time negative effects on the performance of the package structure may be further reduced, too.

In other embodiments, the first oxide layer may be made of hafnium oxide, aluminum oxide, or lanthanum oxide; and the second oxide layer may also be made of hafnium oxide, aluminum oxide, or lanthanum oxide.

In one embodiment, for the purpose of reducing process difficulties, the first 350 and the second 250 oxide layers have the same thickness.

The thickness of the first 350 and the second 250 oxide layers is limited in a range. If the thickness is too thin, uniformity and quality of the first 350 and the second 250 oxide layers would be compromised. In contrast, if the thickness is too thick, the overall thickness of the package structure would be too thick, process integrability would be sacrificed, and excessive thickness of the package structure would increase process difficulty of through-hole etching during the package structure manufacturing process. In one embodiment, the first oxide layer 350 has a thickness in the range of 1000 Å to about 30000 Å, and the second oxide layer 250 has a thickness in the range of about 1000 Å to about 30000 Å.

The encapsulation layer 400 covers the second chips 200 and the front surface 301 of the device wafer 300. The encapsulation layer 400 functions as sealing and moisture proofing, protecting the first chips 310 and the second chips 200, decreasing the probabilities of the first chips 310 and the second chips 200 being damaged, contaminated, and oxidized, thereby further optimizing properties of the package structure.

The encapsulation layer 400 is in contact with the first oxide layer 350. Appropriate properties of water adsorption and chemical stability of the encapsulation layer 400 are beneficial in further increasing good performance and reliability of the package structure.

In one embodiment, the encapsulation layer 400 is made of epoxy. Epoxy has advantages of low shrinkage, good adhesive properties, corrosion resistance, good electrical properties, and low cost, thereby epoxy is widely used as package material for electronic devices and integrated circuits. In other embodiments, the encapsulation layer may be made of polyimide or thermoset materials such as silicone rubber.

In one embodiment, the encapsulation layer 400 may have a wafer shape. The diameter of the wafer shaped encapsulation layer may be same as the diameter of the device wafer 300. In other embodiments, the encapsulation layer may have other suitable shapes.

The wafer-level package structure may also include a first interconnection structure 410, positioned in the device wafer 300 and electrically connected with the first chip 310; and a second interconnection structure 420, positioned in the device wafer 300 and electrically connected with the second chip 200.

The first 410 and the second 420 interconnection structures are used for electrically connecting the first chip 310 and the second chip 200 with other electric circuits, and electrically connecting the first chip 310 with the second chip 200.

For example, the first interconnection structure 410 is electrically connected with the metal interconnection structure in the first chip 310; and the second interconnection structure 420 is electrically connected with the second pad 210 in the second chip 200.

In one embodiment, the first 410 and the second 420 interconnection structures are through-silicon via interconnection structures in terms that the first 410 and the second 420 interconnection structures are formed by a through-silicon via etching process and a plating process.

In one embodiment, the first 410 and the second 420 interconnection structures are made of copper material. In other embodiments, the first 410 and the second 420 interconnection structures may be made of aluminum, tungsten, or titanium.

The wafer-level package structures may be manufactured by the packaging method of WLSiP as described in one of the previous embodiments. The wafer-level package structures may also be manufactured by other packaging methods. For more detailed description of the wafer-level package structure, please refer to relevant descriptions of the previous embodiments, which will not be repeated here.

Optionally, the fusion bonding process in the packaging method includes the following steps: treating surfaces of the first and the second oxide layers by plasma activation, deionized water cleaning, and drying processes sequentially. After the drying process, the second oxide layer is positioned followed by attachment with the first oxide layer correspondingly according to a pre-set relative position relationship between the first and second chips. A compressional force is applied on the device wafer and the second chips to conduct a pre-bonding treatment. After the pre-bonding treatment, an annealing process is conducted for the device wafer and the second chips.

Optionally, after forming the second oxide layer on the bonding surface, the surface of the second chip that faces away from the bonding surface is temporally bonded with the carrier substrate. Or, after the surface of the second chip that faces away from the bonding surface is temporarily bonded with the carrier substrate, a second oxide layer is deposited on the bonding surface.

Optionally, after forming the encapsulation layer, the first back surface is thinned. Then, a first interconnection structure is formed in the device wafer to electrically connect the first chip and a second interconnection structure is formed in the device wafer to electrically connect the second chip.

Optionally, the first oxide layer is made of a material including silicon oxide, hafnium oxide, aluminum oxide, or lanthanum oxide and the second oxide layer is made of a material including silicon oxide, hafnium oxide, aluminum oxide, or lanthanum oxide. The first and the second oxide layers are made of same material.

Optionally, a reactive gas for the plasma activation process includes Ar, $N_2$, $O_2$, $SF_6$, or a combination of two or more of the above gases.

Optionally, the parameters for the plasma activation process are as follows: a radiofrequency power is from about 20 W to about 200 W; a process pressure is from about 0.1 mbar to about 10 mbar; and a processing time is from about 0.1 minute to about 10 minutes.

Optionally, for the pre-bonding treatment, the bonding compressional force is about 1 N to about 20 N; and the treatment time is from about 1 second to about 60 seconds.

Optionally, for the annealing process, the annealing temperature is about 200° C. to about 500° C.; and the process time is about 20 minutes to about 200 minutes.

Optionally, the first or the second oxide layers are formed by a process including atomic layer deposition, low pressure chemical vapor deposition, metal organic chemical vapor deposition (MOCVD), physical vapor deposition (PVD), or pulsed laser deposition (PLD).

Optionally, the surface of the second chip, which faces away from the bonding surface, is temporarily bonded with the carrier substrate by an adhesive layer or electrostatic bonding.

Optionally, the second chip includes a second front surface comprising a pad and a second back surface opposite to the second front surface. The bonding surface is the second front surface or the second back surface.

Optionally, the wafer-level package structure further includes a first interconnection structure, positioned in the device wafer and electrically connecting the first chip; and a second interconnection structure, positioned in the device wafer and electrically connecting the second chip.

Optionally, the first oxide layer is made of a material including silicon oxide, hafnium oxide, aluminum oxide, or lanthanum oxide and the second oxide layer is made of a material including silicon oxide, hafnium oxide, aluminum oxide, or lanthanum oxide. The first and the second oxide layers are made of same material.

Optionally, the first oxide layer has a thickness ranging from 1000 Å to 30000 Å. and the second oxide layer has a thickness ranging from 1000 Å to 30000 Å.

Optionally, the second chip includes a second front surface that comprises a bond pad and a second back surface opposite to the second front surface. The bonding surface includes the second front surface or the second back surface.

As disclosed, the technical solution of the present disclosure has the following advantages.

In the embodiment of the present disclosure, a first oxide layer is formed on the first front surface of the device wafer. After forming a second oxide layer on the bonding surface of the second chip, the second chip is bonded with the device wafer through bonding of the first and second oxide layers using a fusion bonding process. In the fusion bonding process, the first and second oxide layers are bonded by chemical covalent bonds, accomplishing a strong bonding strength between the first and second oxide layers, thereby increasing bonding reliability, bonding strength between the device wafer and the second chip, and production yield.

In an optional approach, for building electrical connection between the device wafer and the second chip, after the second chip is bonded with the device wafer, first and second interconnection structures are formed in the device wafer to electrically connect the first chip and the second chip, respectively. The process of forming the second interconnection structure includes a through-hole etching process, which etches the device wafer and the second chip sequentially. Because the second oxide layer is made of inorganic material and the device wafer is also made of inorganic material, using the first and the second oxide layers as bonding layers has the benefit of reduction of process difficulties in the subsequent through-hole etching process, thereby improving electrical connection properties of the second interconnection structure.

The embodiments disclosed herein are exemplary only. Other applications, advantages, alterations, modifications, or equivalents to the disclosed embodiments are obvious to those skilled in the art and are intended to be encompassed within the scope of the present disclosure. The protection of the present disclosure is limited by the scope of the claims only.

What is claimed is:

1. A wafer-level package structure, comprising:
   a device wafer, integrated with a first chip at a frontside of the first chip and a first surface of the device wafer,
   a first oxide layer formed on the first surface of the device wafer;
   a second chip including a front surface;
   a second oxide layer formed on the front surface of the second chip,
      wherein the second chip is bonded with the device wafer by a fusion bonding between the second oxide layer formed on the front surface of the second chip and the first oxide layer on the device wafer;
   an encapsulation layer, formed on the first oxide layer and covering the second chip;
   a first interconnection structure connecting to a backside of the first chip and extending in the device wafer toward a second surface opposite to the first surface of the device wafer; and
   a second interconnection structure connecting to the second chip in the encapsulation layer and extending into the device wafer toward the second surface of the device wafer.

2. The structure according to claim 1, wherein:
   the second interconnection structure extends into the device wafer through the first oxide layer and the second oxide layer.

3. The structure according to claim 1, wherein:
   the first oxide layer is made of a material including silicon oxide, hafnium oxide, aluminum oxide, lanthanum oxide, or a combination thereof;
   the second oxide layer is made of a material including silicon oxide, hafnium oxide, aluminum oxide, lanthanum oxide, or a combination thereof; and
   the first and the second oxide layers are made of a same material.

4. The structure according to claim 1, wherein:
   the first oxide layer has a thickness ranging from 1000 Å to 30000 Å; and
   the second oxide layer has a thickness ranging from 1000 Å to 30000 Å.

5. The structure according to claim 1, wherein the second chip includes:
   a pad formed in the second chip and having a surface coplanar with the front surface,
   wherein the second interconnection structure is electrically connected to the second chip via the pad.

6. The structure according to claim 1, wherein:
   the first interconnection structure and the second interconnection structure are not physically in contact with each other in the device wafer.

7. The structure according to claim 1, wherein:
   each of the first interconnection structure and the second interconnection structure is exposed by the second surface of the device wafer.

8. The structure according to claim 1, wherein:
   the encapsulation layer further covers the second oxide layer.

9. The structure according to claim 1, wherein:
   a surface of the frontside of the first chip is coplanar with the first surface the device wafer.

10. The structure according to claim 1, wherein:
    the first chip includes a first pad,
    the second chip includes a second pad, and
    the first pad and the second pad are separated by a bonded oxide layer including the first and second oxide layers.

* * * * *